(12) United States Patent
Lu

(10) Patent No.: US 7,375,655 B2
(45) Date of Patent: May 20, 2008

(54) KEYBOARD WITHOUT GHOST KEYS

(75) Inventor: Tien-Min Lu, Taipei Hsien (TW)

(73) Assignee: Zippy Technology Corp., Hsin-Tien, Taipei Hsien (TW)

( * ) Notice: Subject to any disclaimer, the term of this patent is extended or adjusted under 35 U.S.C. 154(b) by 121 days.

(21) Appl. No.: 11/396,657

(22) Filed: Apr. 4, 2006

(65) Prior Publication Data

US 2007/0247339 A1    Oct. 25, 2007

(51) Int. Cl.
*H03K 19/00* (2006.01)
(52) U.S. Cl. .......................... 341/26; 341/22; 714/813
(58) Field of Classification Search .................. 341/20, 341/22, 25, 26; 714/813
See application file for complete search history.

(56) References Cited

U.S. PATENT DOCUMENTS 4,633,228 A * 12/1986 Larson ......................... 341/26
5,448,236 A *  9/1995 Shiga ........................... 341/25

FOREIGN PATENT DOCUMENTS

TW  486661  5/2002
TW  578088  3/2004

\* cited by examiner

*Primary Examiner*—Brian Zimmerman
*Assistant Examiner*—Hung Q Dang
(74) *Attorney, Agent, or Firm*—Muncy, Geissler, Olds & Lowe, PLLC

(57) ABSTRACT

A keyboard without ghost keys has a circuit which includes a microprocessor in which a plurality of I/O lines form a keyboard scanning matrix. Two of the I/O lines on the matrix cross to define a plurality of signal switches. The microprocessor is electrically connected to a primary level resistance and a reference potential to determine the ON condition of the signal switches. Each signal switch further is electrically connected to at least one secondary level switch which is electrically connected to the primary level switch in a serial manner. When a user depresses any three signal switches on the rectangular angles of the keyboard scanning matrix, the connecting primary level resistance and the secondary level resistance form a new level resistance. The new level resistance and the current flowing to the keyboard scanning matrix are processed to get a potential smaller than the reference potential, thereby to eliminate the phenomenon of ghost keys.

6 Claims, 4 Drawing Sheets

KEYBOARD WITHOUT GHOST KEYS

FIELD OF THE INVENTION

The present invention relates to a keyboard and particularly to a keyboard without ghost keys.

BACKGROUND OF THE INVENTION

Keyboard is one of important tools to input signals and communicate with computers. The keyboard has a circuit in response to the computers. The design of the circuit is critical to the quality of the keyboard. The conventional circuit located in the keyboard usually adopts a standard keyboard protocol. The keyboard protocol is serial and provides a specific code for every key except toggle keys (Shift, Ctrl and Alt keys). Referring to FIG. 1 PRIOR ART, the circuit in the keyboard contains a microprocessor 100 which has a plurality of parallel lines and vertical lines 111a, 111b, 112a and 112b that form a matrix 110 to connect to a primary level resistance R1. The matrix 110 crisscrosses to form a plurality of keys 120a, 120b, 120c and 120d. When the key 120a is depressed, the keyboard sends a code representing the key 120a to the computer to be interpreted. When the key 120a returns to the original condition, the keyboard issues a release signal. One cycle of the reciprocal action is treated as one keystroke. When the keyboard is tested the circuit of a preset matrix 110 is used. However, even if all the elements and power supply are in good conditions, a conflict still might happen. This often occurs when a user depresses one key 120a then depresses another key 120b. The system issues the signal of the second key rather than the signals of the two keys. This is because the keyboard codes are mutually exclusive. The preceding signal is masked by the succeeding signal and not recovered.

Another phenomenon occurs when the user depresses two keys 120a and 120b on the rectangular angles of the matrix 110 of the keyboard circuit, then depresses another key 120c (or 120d). The microprocessor 100 cannot accurately determine the signal of the another key 120c (or 120d). This phenomenon is called ghost key. This problem could result in loss of characters when the user depresses the keys at a fast speed. For game players who use the keyboard, they often depress a plurality of keys at the same time to generate toggle key signals to execute different game strategies. The ghost key phenomenon of the keyboard makes the game not be able to be executed smoothly.

To prevent the problem of ghost key when users depress the keys but no effective signal have been generated, R.O.C. patent publication No. 00486661 entitled "Input device using keys defined by multi-dimensional electrodes and coding method thereof" provides a technique to inspect whether a ghost key (or called phantom key) has been depressed. An error signal is sent back. It includes electrodes of N-dimension to define every key on the input device. N is an integer greater than 2. It adopts a key scanning method which scans the electrode of every dimension and records their position data to do comparison and find out the keys being depressed.

R.O.C. patent publication No. 00578088 entitled "Keyboard input device equipped with Blair input function" discloses a simple keyboard to avoid generating ghost keys. It has a simple keystroke input function and the Blair input function. The keyboard includes an input circuit in a key matrix form. On the key matrix, no two keys designated with the Blair input function are connected to a same scanning line. When the input device is using the Blair input function, six keys that are designated with Blair input function can be operated simultaneously in a six-point input system without generating a phantom key on any of the designated keys.

SUMMARY OF THE INVENTION

The primary object of the present invention is to solve the aforesaid disadvantages. The invention provides a keyboard that has a circuit on which a plurality of I/O lines in a microprocessor form a keyboard scanning matrix. The cross points of two I/O lines on the keyboard scanning matrix defines multiple signal switches. The microprocessor is electrically connected to a primary level resistance and also connected to a reference potential to determine which signal switches are in an ON condition.

Each signal switch is electrically connected to at least one secondary level resistance which is electrically connected to the primary level resistance in a serial manner and also is coupled in parallel with a neighboring secondary potential resistance. The keyboard circuit may be formed on a film circuit board by printing. When a user depresses any three signal switches on the rectangular angles of the keyboard scanning matrix, the connecting condition of the primary level resistance and the secondary level resistance forms a new level resistance. The new level resistance and the current flowing to the keyboard scanning matrix are processed to generate a potential smaller than the reference potential. Thereby the phenomenon of ghost key can be eliminated. In addition, the microprocessor can detect a signal switch on the vertical and parallel I/O lines that is in the OFF condition through a low potential detection method or a high potential detection method. This also can prevent the ghost key phenomenon from occurring.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
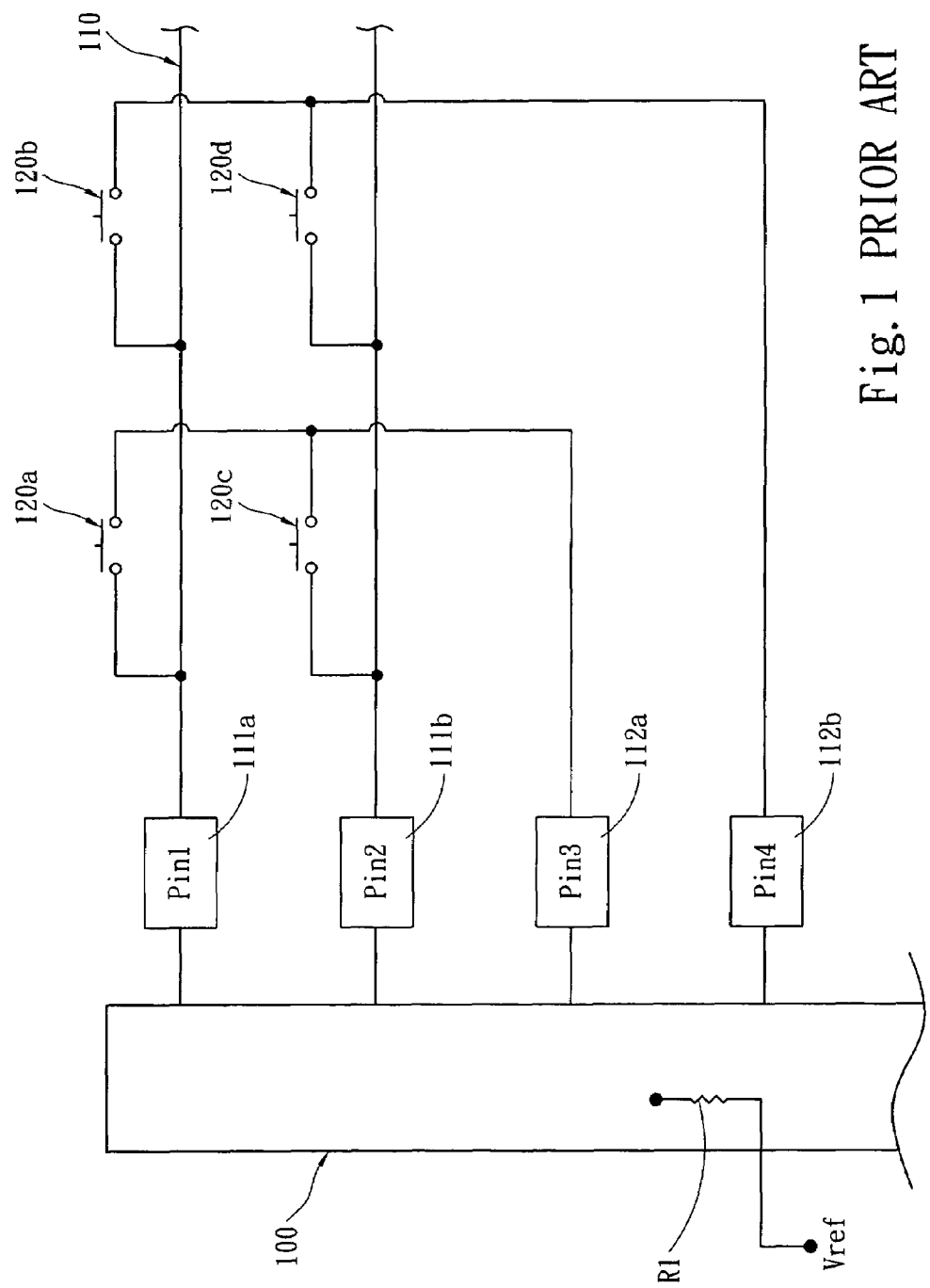
FIG. 1 PRIOR ART is a circuit diagram of a conventional circuit.
Figure 2:
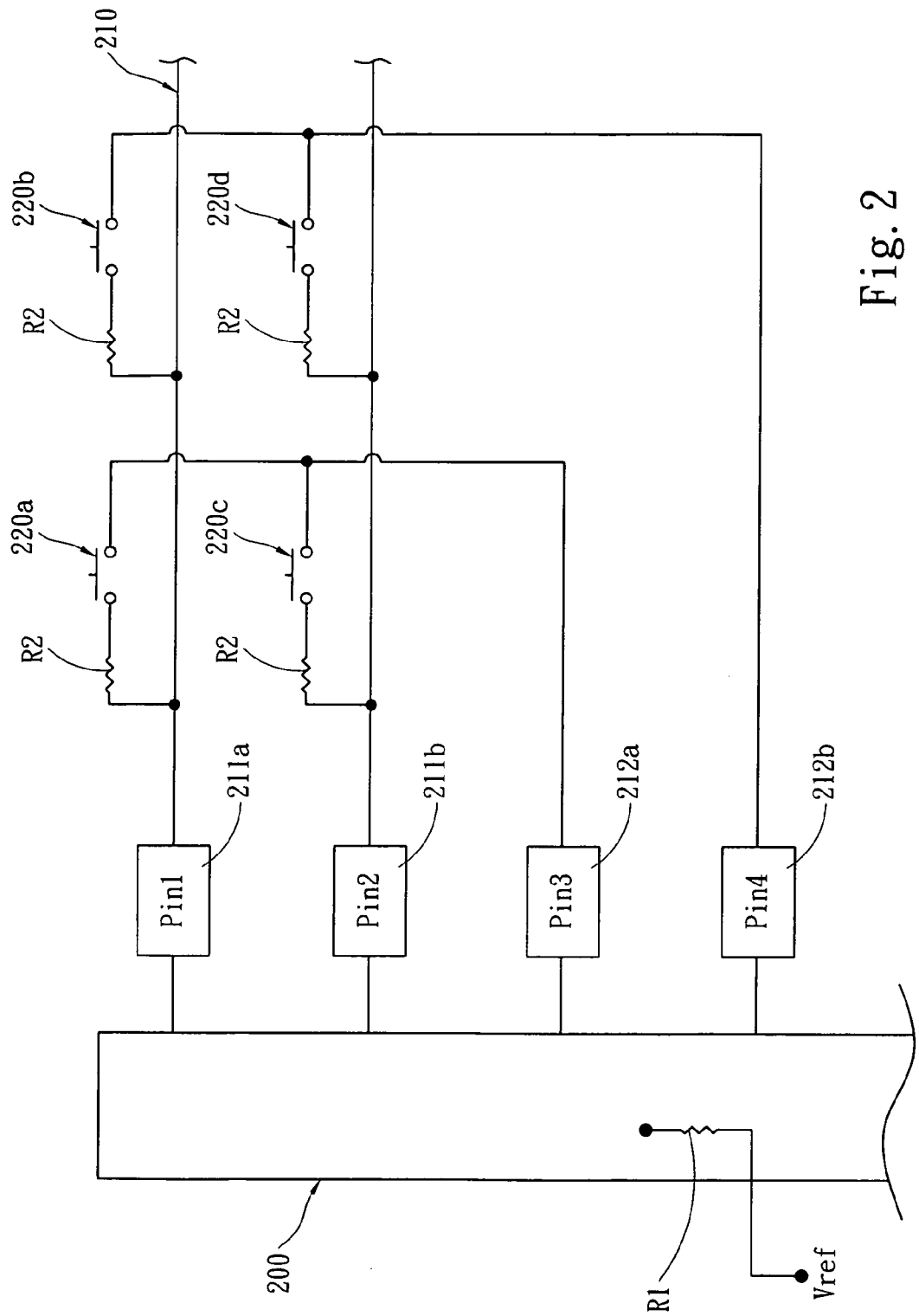
FIG. 2 is a circuit diagram of an embodiment of the invention.

Please refer to FIG. 2 for a circuit diagram of the invention. The keyboard contains a circuit which has a microprocessor 200 in which a plurality of parallel I/O lines 211a and 211b and vertical I/O lines 212a and 212b form a keyboard scanning matrix 210. The parallel I/O lines 211a and 211b and the vertical I/O lines 212a and 212b on the keyboard scanning matrix 210 crisscross to define a plurality of signal switches 220a, 220b, 220c and 220d. The microprocessor 200 further is electrically connected to a primary level resistance R1 and a reference potential Vref to determine the ON condition of the signal switches 220a, 220b, 220c and 220d.

Figure 3:
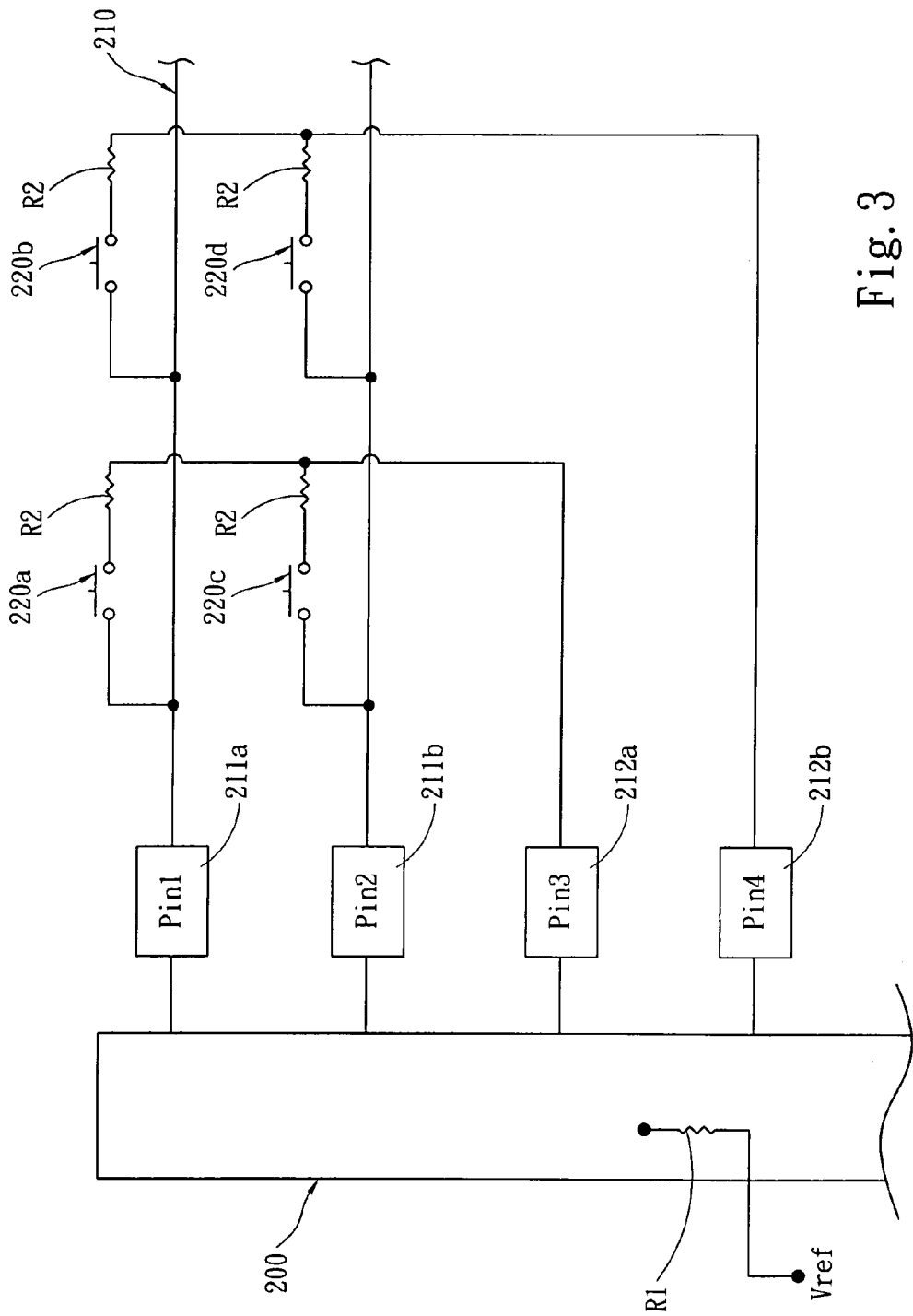
FIG. 3 is a circuit diagram of another embodiment of the invention.
Figure 4:
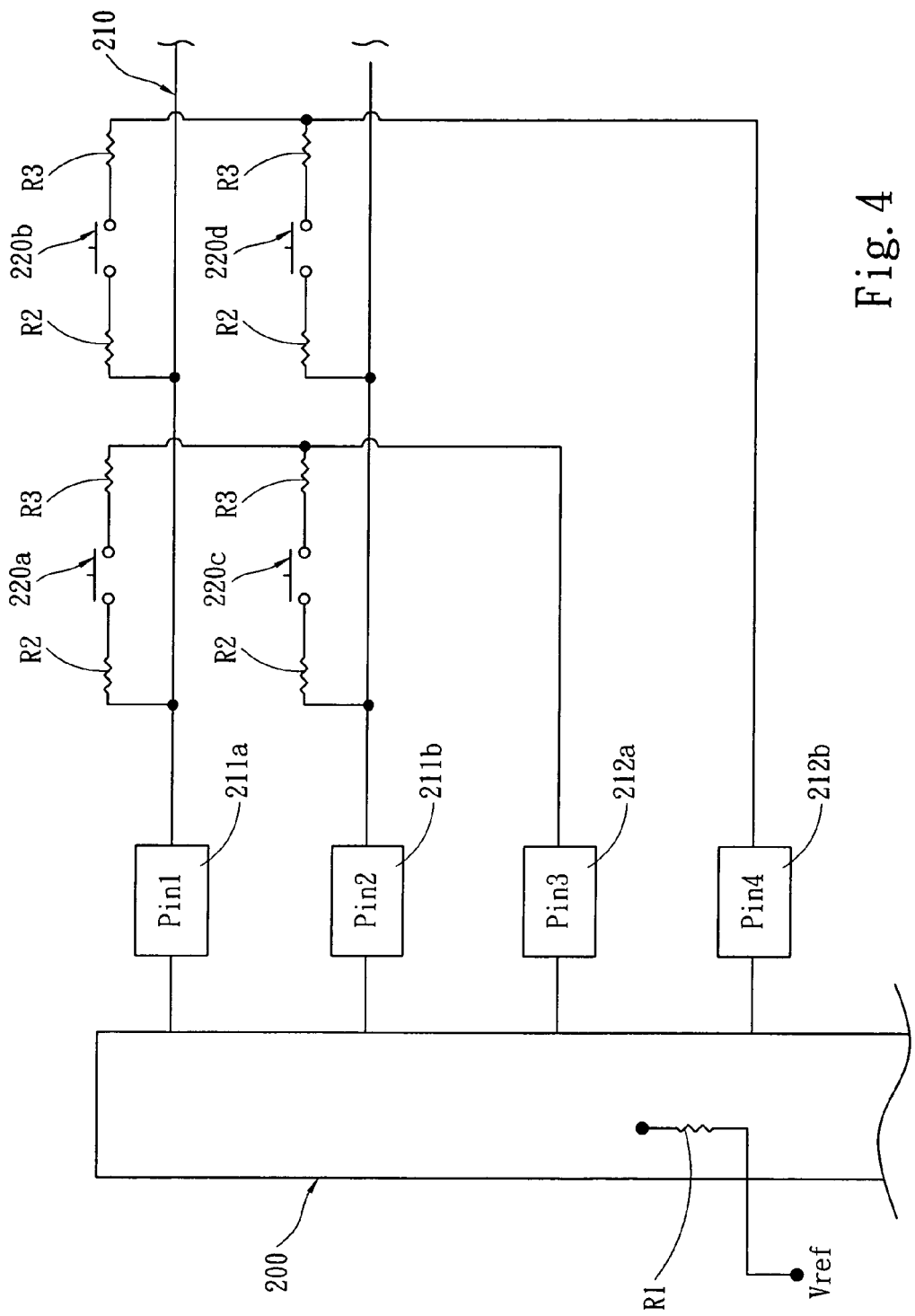
FIG. 4 is a circuit diagram of yet another embodiment of the invention.

The signal switches 220a, 220b, 220c and 220d are electrically connected to at least one secondary level resistance R2 which also is electrically connected to the primary level resistance R1 in a serial manner. The secondary level resistance R2 also is coupled in parallel with another secondary level resistance R2 on a neighboring parallel I/O lines 211a and 211b. The serial electric connection can be divided into three conditions: 1: the secondary level resistance R2 electrically connected to the primary level resistance R1 in a serial manner is located in front of a conductive point of the signal switches 220a, 220b, 220c and 220d (as shown in FIG. 2); 2: the secondary level resistance R2 electrically connected to the primary level resistance R1 in a serial manner is located behind the conductive point of the signal switches 220a, 220b, 220c and 220d (as shown in FIG. 3); and 3: there are secondary level resistances R2 and R3 electrically connected to the primary level resistance R1 in a serial manner and are located respectively in front of and behind the conductive point of the signal switches 220a, 220b, 220c and 220d (as shown in FIG. 4). When a user depresses any three of the four signal switches 220a, 220b, 220c and 220d formed by crossing of the vertical I/O lines 212a and 212b, and the parallel I/O lines 211a and 211b to generate a toggle key signal, as the primary level resistance R1 and the secondary level resistances R2 and R3 are connected, a new level resistance is formed. The new level resistance and the current flowing to the keyboard scanning matrix 210 are processed to get a potential smaller than the reference potential Vref. Hence ghost keys can be eliminated.

Moreover, the microprocessor 200 can determine through a low potential detection method or a high potential detection method the ON condition of the signal switches 220a, 220b, 220c and 220d. When the microprocessor 200 detects the potential of the parallel I/O lines 211a and 211b through the low potential detection method, in the condition in which the signal switch 200a is ON, the component of voltage of R1 and R2 must make the potential of the parallel I/O lines 211a and 211b below the reference potential Vref, then the microprocessor 200 can detect the ON condition of the signal switch 220a. On the other hand, if the potential of the parallel I/O lines 211a and 211b is higher than the reference potential Vref, the detected signal switch 220a is in an OFF condition. When the microprocessor 200 detects through the higher potential detection method, in the condition in which the signal switch 200a is ON, the component of voltage of R1 and is R2 must make the potential of the parallel I/O lines 211a and 211b higher than the reference potential Vref, then the microprocessor 200 can detect the ON condition of the signal switch 220a. Otherwise the detected signal switch 220a is in the OFF condition.

To determine the signal switch 220d on the vertical I/O lines 212a and 212b and parallel I/O lines 211a and 211b in the OFF condition, when the microprocessor 200 adopts the low potential detection method, the circuit of voltage component of the primary level resistance R1 and secondary level resistances R2 and R3 must make the potential of the parallel I/O lines 211b during scanning the signal switch 220d higher than the reference potential Vref, then the detected signal switch 220d is in the OFF condition. On the other hand, when the microprocessor 200 adopts the high potential detection method, the circuit of voltage component of the primary level resistance R1 and secondary level resistances R2 and R3 must make the potential of the parallel I/O lines 211b during scanning the signal switch 220d lower than the reference potential Vref, then the detected signal switch 220d is in the OFF condition. These two methods can prevent the ghost key phenomenon from occurring.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A keyboard without ghost keys comprising a circuit which has a microprocessor in which a plurality of I/O lines form a keyboard scanning matrix, two of the I/O lines being crossed to define a plurality of signal switches, the microprocessor being electrically connected to a primary level resistance and a reference potential to determine an ON condition of the signal switches, wherein:

the signal switches are electrically connected to at least one secondary level resistance which is electrically connected to the primary level resistance in a serial manner and coupled in a parallel manner with another secondary level resistance on a neighboring parallel I/O line, depressing any three signal switches of four signal switches formed by vertical and parallel I/O lines generating a toggle key signal, the primary level resistance and the secondary level resistance being connected in a serial and parallel manner to form a new level resistance to eliminate the ghost keys;

wherein the secondary level resistances are located in front of and behind a conductive point of the signal switches to connect to the primary level resistance in a serial manner.

2. The keyboard of claim 1, wherein the secondary level resistance is located in front of a conductive point of the signal switches to connect to the primary level resistance in a serial manner.

3. The keyboard of claim 1, wherein the secondary level resistance is located behind a conductive point of the signal switches to connect to the primary level resistance in a serial manner.

4. The keyboard of claim 1, wherein the microprocessor determines the ON condition of the signal switches through a low potential detection method.

5. The keyboard of claim 1, wherein the microprocessor determines the ON condition of the signal switches through a high potential detection method.

6. The keyboard of claim 1, wherein the circuit in the keyboard is printed on a film circuit board.

* * * * *